(12) United States Patent
Eng et al.

(10) Patent No.: US 6,828,166 B2
(45) Date of Patent: Dec. 7, 2004

(54) LOW TEMPERATURE DISTRIBUTED FEEDBACK LASER WITH LOSS GRATING AND METHOD

(75) Inventors: Lars E. Eng, Fogelsville, PA (US); Ram Jambunathan, Allentown, PA (US); Kishore K. Kamath, Whitehall, PA (US); Alexander Robertson, Lawrenceville, NJ (US); Daniel Paul Wilt, Orefield, PA (US)

(73) Assignee: Agere Systems, Inc., Allentown, PA (US)

(*) Notice: Subject to any disclaimer, the term of this patent is extended or adjusted under 35 U.S.C. 154(b) by 12 days.

(21) Appl. No.: 10/235,714

(22) Filed: Sep. 6, 2002

(65) Prior Publication Data

US 2003/0002557 A1 Jan. 2, 2003

Related U.S. Application Data

(62) Division of application No. 09/437,424, filed on Nov. 15, 1999, now Pat. No. 6,477,194.

(51) Int. Cl.$^7$ .............................................. H01L 21/00
(52) U.S. Cl. ............................ 438/22; 438/32; 438/48
(58) Field of Search ............................ 438/22, 32, 31, 438/39, 48; 372/45, 96, 49

(56) References Cited

U.S. PATENT DOCUMENTS

| 4,751,710 | A |   | 6/1988 | Yamaguchi et al. |
|---|---|---|---|---|
| 4,796,273 | A | * | 1/1989 | Yamaguchi .................. 372/96 |
| 4,802,187 | A |   | 1/1989 | Bouley et al. |
| 4,833,684 | A |   | 5/1989 | Krekels et al. |
| 4,951,292 | A |   | 8/1990 | Kuindersma et al. |
| 4,993,035 | A |   | 2/1991 | Laikhtman |
| 5,012,484 | A |   | 4/1991 | Flynn et al. |
| 5,091,916 | A |   | 2/1992 | Cimini, Jr. et al. |
| 5,208,824 | A |   | 5/1993 | Tsang |
| 5,285,468 | A |   | 2/1994 | Ackerman et al. |
| 5,329,542 | A |   | 7/1994 | Westbrook |
| 5,346,855 | A |   | 9/1994 | Byrne et al. |
| 5,412,675 | A |   | 5/1995 | Odagawa |
| 5,452,318 | A |   | 9/1995 | Makino et al. |
| 5,506,859 | A |   | 4/1996 | Ackerman et al. |
| 5,581,572 | A |   | 12/1996 | Delorme et al. |
| 5,668,900 | A |   | 9/1997 | Little et al. |
| 5,696,615 | A |   | 12/1997 | Alexander |
| 5,727,013 | A | * | 3/1998 | Botez et al. .................. 372/96 |
| 5,729,347 | A |   | 3/1998 | So |
| 5,821,570 | A |   | 10/1998 | Kazmierski et al. |
| 5,903,585 | A |   | 5/1999 | Dawson et al. |
| 5,926,493 | A | * | 7/1999 | O'Brien et al. ............... 372/45 |
| 5,943,554 | A |   | 8/1999 | Dautremont-Smith et al. |
| 6,151,351 | A |   | 11/2000 | Kito et al. |
| 6,201,824 | B1 | * | 3/2001 | Hong et al. .................. 372/50 |
| 6,233,045 | B1 | * | 5/2001 | Suni et al. .................. 356/28.5 |

FOREIGN PATENT DOCUMENTS

DE          44124872 A      1/1993

OTHER PUBLICATIONS

Kotaki et al.; "Wavelength tunable DFB and DBR lasers for coherent optical fibre communications"; IEE Proceedings–J, vol., 138, No. 2, Apr. 1991, pp. 171–177.*

Tohmori et al.; "Broad–Range Wavelength–Tunable Superstructure Grating (SSG) DBR Lasers"; IEEE Journal of Quantum Electronics, vol. 29, No. 6, Jun. 1993; pp. 1817–1823.*

(List continued on next page.)

Primary Examiner—Hsien-Ming Lee
(74) Attorney, Agent, or Firm—Dickstein Shapiro Morin & Oshinsky LLP

(57) ABSTRACT

A low threshold distributed feedback (DFB) laser is constructed for improved performance at subzero temperatures. A loss grating is employed to enhance the probability that lasing occurs near the short wavelength side of the stopband and to counteract the effect of negative gain tilt that occurs when DFB lasers are positively detuned. A method of making DFB lasers from wafers with improved yield for low temperature side mode suppression ratio (SMSR) is also disclosed.

22 Claims, 3 Drawing Sheets-

OTHER PUBLICATIONS

"1.55 um Gain–Coupled Quantum–Well Distributed Feedback Lasers with High Single–Mode Yield and Narrow Linewidth" by Brochert, et al, IEEE Transactions Photonics Technology Letters, vol. 3, No. 11, Nov. 1991, pp. 955–957.*

"Wide Temperature–range Singlemode Operation and MQW Gain–coupled DFB Lasers" by T. Makino, et al, Electronic Letters, vol. 30, No. 23, Nov. 1994, pp. 1948–1951.*

High–Speed Complex–Coupled Strain–Compensated AlGaInAs/InP 1.5 um DFB Laser Diodes, by F. Steinhagen, et al, IEEE, vol. Conf. 8, Apr. 1996, pp. 777–780.*

"Properties of Loss–Coupled Distributed Feedback Laser Arrays for Wavelength Division Multiplexing Systems", Stefan Hansmann, et al, Journal of Lightwave Technology, vol. 15, No. 7, Jul. 1997, pp. 1191–1197.*

* cited by examiner-

LOW TEMPERATURE DISTRIBUTED FEEDBACK LASER WITH LOSS GRATING AND METHOD

This application is a divisional of application Ser. No. 09/437,424, filed on Nov. 15, 1999 now U.S. Pat. No. 6,477,194, which is hereby incorporated by reference.

FIELD OF THE INVENTION

The present invention relates to semiconductor lasers and methods of making and using such devices, and more particularly, to distributed feedback (DFB) lasers that operate satisfactorily at low temperatures. The invention also relates to a method of making DFB lasers from semiconductor wafers and the like.

BACKGROUND OF THE INVENTION

Distributed feedback (DFB) lasers may be used, for example, as sources of signal radiation for optical fiber communications systems, as optical pumps, and as devices for generating coherent optical pulses. In a conventional DFB device, feedback is provided in the longitudinal direction (the emission direction) by an index grating (a periodic array of materials having different optical indices). In another type of DFB laser, a loss grating is used to provide a periodic variation in loss in the longitudinal direction.

There is a need in the art for semiconductor DFB lasers that provide improved performance under conditions, such as low temperature, where they would be positively detuned and suffer degradation in side mode suppression ratio (SMSR, discussed in more detail below).

FIG. 1 shows the relationship between output light intensity I and wavelength $\lambda$ for a typical DFB laser, where: $\lambda_m$ corresponds to the side mode on the short wavelength side of the stopband; $\lambda_o$ corresponds to the selected lasing mode; and $\lambda_p$ corresponds to the side mode on the long wavelength side of the stopband. With reference to FIG. 1, the lasing symmetry $L_{sym}$ for a particular device may be defined as follows:

$$L_{sym} = (\lambda_p - \lambda_o)/(\lambda_p - \lambda_m). \quad (1)$$

According to equation (1), if the lasing symmetry $L_{sym}$ is smaller than 0.5, then $\lambda_o$ is closer to $\lambda_p$, and if $L_{sym}$ is greater than 0.5, then $\lambda_o$ is closer to $\lambda_m$.

The loss function for a DFB laser may be expressed in terms of the coupling coefficient $\kappa$, as follows:

$$\kappa = \kappa^1 + jn, \text{ where} \quad (2)$$

$\kappa^1$ represents the real part of the coupling coefficient $\kappa$, and jn represents the imaginary part of the coefficient $\kappa$. In a pure index grating DFB laser, jn=0, and there is an equal probability of lasing on the long or short wavelength sides of the stopband, as discussed in more detail below.

The term "side mode suppression ratio"(or sub-mode suppression ratio) refers to the ratio of main longitudinal mode power to side longitudinal mode power. Some high capacity fiber optic communications systems require a light source that generates a single longitudinal laser mode. A communications system may require a side mode suppression ratio exceeding 30 dB, for example. For a DFB laser to operate in a single longitudinal mode, the side longitudinal modes should be suppressed to relatively insignificant power levels.

The side mode suppression ratio (SMSR) changes when the laser is tuned to different operating wavelengths. A DFB laser may exhibit acceptable side mode suppression at certain wavelengths, but unacceptable side mode suppression when tuned to other wavelengths. A small tuning change may cause a 10 dB to 20 dB decrease in the SMSR. This is because the relative net threshold gain required for each mode varies as the laser is tuned. When the main longitudinal mode is centered within the reflection characteristics of the laser, side mode suppression is usually optimized. As the device is tuned away from the optimum position, one of the side longitudinal modes is moved closer to the center of the reflection characteristics.

SUMMARY OF THE INVENTION

A distributed feedback (DFB) laser having a lasing symmetry $L_{sym} > 0.5$ provides improved performance (high SMSR) under conditions where it would be positively detuned. An example of a condition where a DFB laser would be positively detuned is at low temperatures (for example, $-15°$ C. to $-40°$ C.). Thus, the production yield of DFB devices that perform well at low temperature can be increased by forming them in such a way as to increase the likelihood that the devices have lasing symmetries greater than 0.5.

A DFB laser is "positively detuned" when its lasing wavelength (selected mode) is on the long wavelength side of the peak of the material gain spectrum. If the lasing mode is on the long wavelength side, the inherent gain margin is reduced by the relatively large negative gain tilt $(dg/d\lambda)$ on the long wavelength side. By adding a small amount of loss to the laser grating (that is, by making jn>0), the likelihood that the device will lase on the long-wavelength side of the stop band is reduced. In other words, a DFB laser with a loss grating is more likely to have a lasing symmetry $L_{sym} > 0.5$. If more devices from a wafer are produced with $L_{sym} > 0.5$, then the yield to the low temperature performance requirement is increased.

The present invention relates to a method of making low threshold semiconductor DFB lasers for low temperature operation. The method includes the steps of: (1) providing a multi-layer semiconductor structure, such as a wafer, having an active layer, a loss grating, and a spacer layer; and (2) cleaving the multi-layer structure such that opposed facets intersect the loss grating. The cleaving process is such that the precise location at which a particular facet intersects the loss grating cannot be controlled in advance. As discussed in more detail below, the performance characteristics of the laser depend in part on the phase relationships between the randomly determined locations of the facets and the periodic structure of the loss grating.

According to a preferred embodiment of the invention, the facets may be covered by highly reflective and anti-reflective coatings, and other structures such as claddings, substrates, electrodes, etc. may also be provided.

According to another aspect of the invention, the loss grating may be grown on a semiconductor substrate by a metal organic chemical vapor deposition (MOCVD) process. In a preferred embodiment of the invention, the loss grating has a high As content and therefore is well suited for reliable growth according to an MOCVD process. In another embodiment of the invention, the loss grating may be formed by molecular beam epitaxy.

According to another aspect of the invention, lasers are constructed to provide high side mode suppression under conditions where they would be positively detuned. An example of such conditions is where the operating temperature is less than about minus fifteen degrees Celsius ($-15°$ C.).

The present invention also relates to a DFB laser for low temperature single mode operation, including: an active layer for producing optical gain; a loss grating for shifting the emission spectrum to the short wavelength side of the stopband; and a spacer layer located between the active layer and the loss grating. According to a preferred embodiment of the invention, the device has a lasing symmetry $L_{sym}>0.5$. Consequently, the device does not lase on the long wavelength side of the stopband under low temperature conditions. The low operating temperature may be, for example in the range of from $-15°$ to $-40°$ C.

According to another aspect of the invention, a DFB laser is constructed to have a high SMSR, to operate at a low threshold, and to exhibit minimal mode hopping, all at low temperatures.

According to another aspect of the invention, a device is provided that operates in a single longitudinal mode, with a large gain threshold difference, and that has facet-reflectivity-independent parameters, and low sensitivity to feedback.

In a preferred embodiment of the invention, the problems of the prior art are overcome by using a loss grating to shift the distribution of lasing modes, generated by random facet phases, to the short wavelength side of the stopband. The loss grating counteracts the effect of the negative gain tilt that occurs in DFB lasers due to positive detuning at subzero temperatures. According to the present invention, temperature-induced variations of the operational characteristics of a DFB laser are minimized.

DETAILED DESCRIPTION OF PREFERRED EMBODIMENTS

Figure 1:
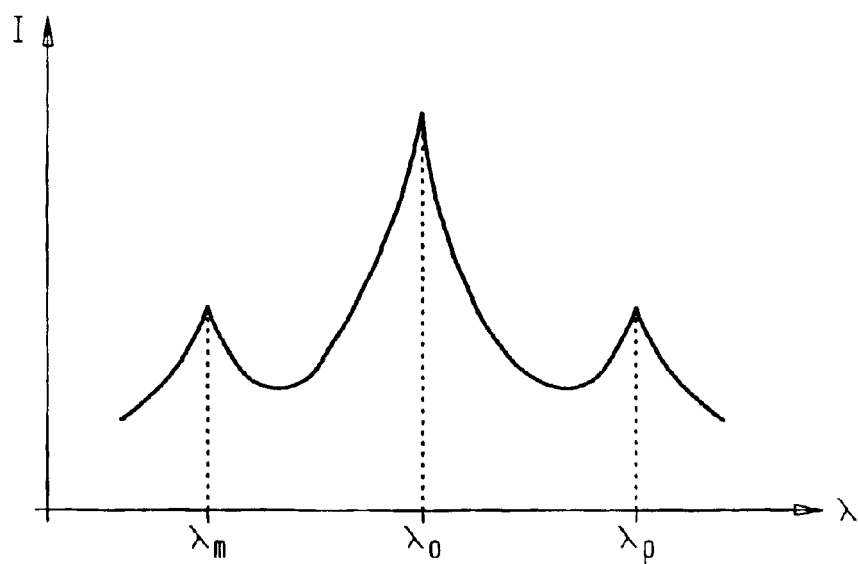
FIG. 1 illustrates the mode intensity distribution for a typical distributed feedback laser.
Figure 2:
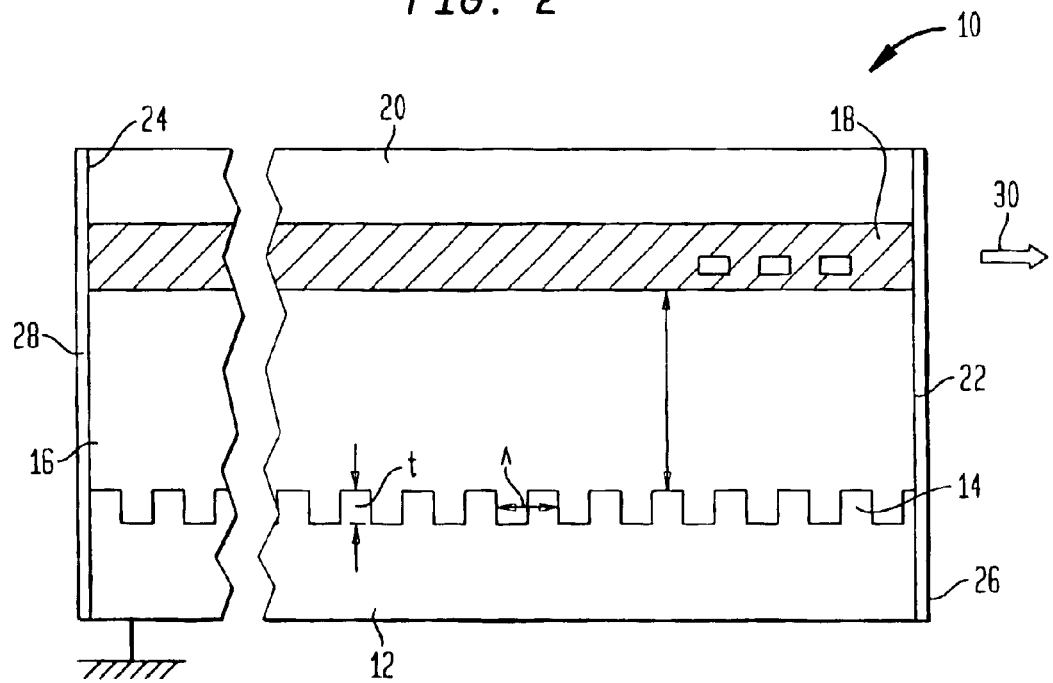
FIG. 2 is a schematic side view of a DFB laser constructed in accordance with a preferred embodiment of the present invention.

Referring now to the drawings, where like reference numerals designate like elements, there is shown in FIG. 2 a distributed feedback (DFB) laser 10 constructed in accordance with a preferred embodiment of the present invention. The device 10 includes a semiconductor substrate 12, a loss grating 14, a spacer layer 16, an active region 18 and a cladding structure 20. The cladding structure 20 may be formed of plural layers in a manner known in the art.

In addition, the device 10 has front and back facets 22, 24. The facets 22, 24 may be formed by cleaving the device 10 from a wafer (not shown). An anti-reflective (AR) layer 26 is coated on the front facet 22. A highly reflective (HR) layer 28 is coated on the back facet 24. The thicknesses of the two coatings 26, 28 correspond to the wavelength of the emitted light 30.

In operation, an electrical current is caused to flow through the active region 18 in a known manner. The current causes the active region 18 to generate light (or gain), such that a signal 30 is emitted through the AR layer 26. The signal 30 may have a wavelength in the range of from 1.3 $\mu$m to 1.6 $\mu$m for use in an optical communications system, for example. As discussed in more detail below, the illustrated laser 10 performs satisfactorily, with high side mode suppression, even at low temperatures, for example, in the range of from $-15°$ C. to $-40°$ C.

The substrate 12 may be formed of doped InP or another suitable semiconductor material. The loss grating 14 may be formed of InGaAsP, with a high As mole fraction, and is preferably lattice matched to the substrate 12 with a band gap that is 50 nm to 100 nm greater than the targeted lasing wavelength. The loss grating 14 has an alternating, periodic structure in the longitudinal direction of the device 10 (the longitudinal direction is the direction of light emission). The grating period $\Lambda$ is preferably in the range of from about 2,000 Å to about 2,500 Å. The thickness t of the loss grating 14 may be in the range of from about 200 Å to about 500 Å, for example.

The spacer layer 16 is located between the loss grating 14 and a lower portion of the active region 18. The spacer layer 16 may be formed of InP. In the illustrated embodiment, the thickness 32 of the spacer layer 16 may be in the range of from about 3,000 Å to about 6,000 Å. The present invention should not be limited, however, to the details of the preferred embodiments described herein.

The active region 18 may be formed of bulk InGaAsP and/or multiple quantum wells. There may be for example, five to nine quantum wells with a 1% compressive strain. Each quantum well layer may have a width of about 70 Å.

Since the device 10 is cleaved from a wafer, the cleaved facets 22, 24 intersect the periodic grating 14 at random, arbitrary locations. When a plurality of devices 10 are cleaved from a single wafer (not shown), the performance of each device 10 depends on the randomly determined locations of the facets 22, 24 relative to the grating 14. The loss grating 14 is formed across the entire wafer before the cleaving operation. Consequently, the lasers 10 have facets 22, 24 intersecting the periodic loss grating 14 at different phases Ø. Some devices 10 will perform differently than others, depending on the phases Ø of the loss grating 14 at the points of intersection with the facets 22, 24.

The relationship between the facet reflectivity R on either end of the device 10 and the respective facet phase Ø is as follows:

$$R = e^{i\emptyset} \quad (3)$$

Figure 3:
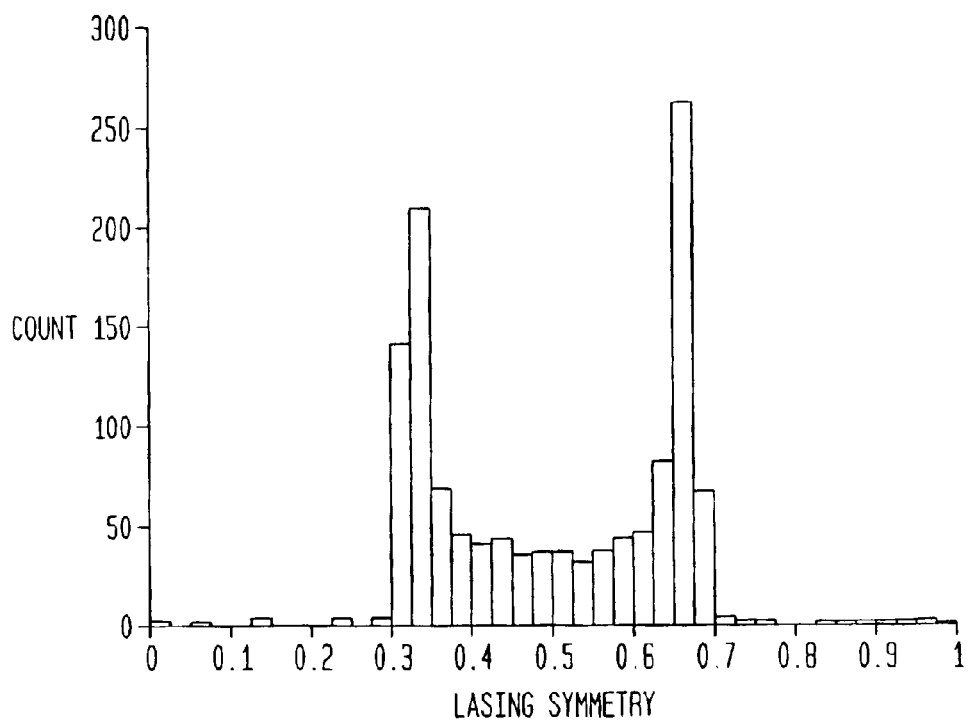
FIG. 3 is a histogram showing the distribution of lasing symmetries for DFB lasers with index gratings.
Figure 4:
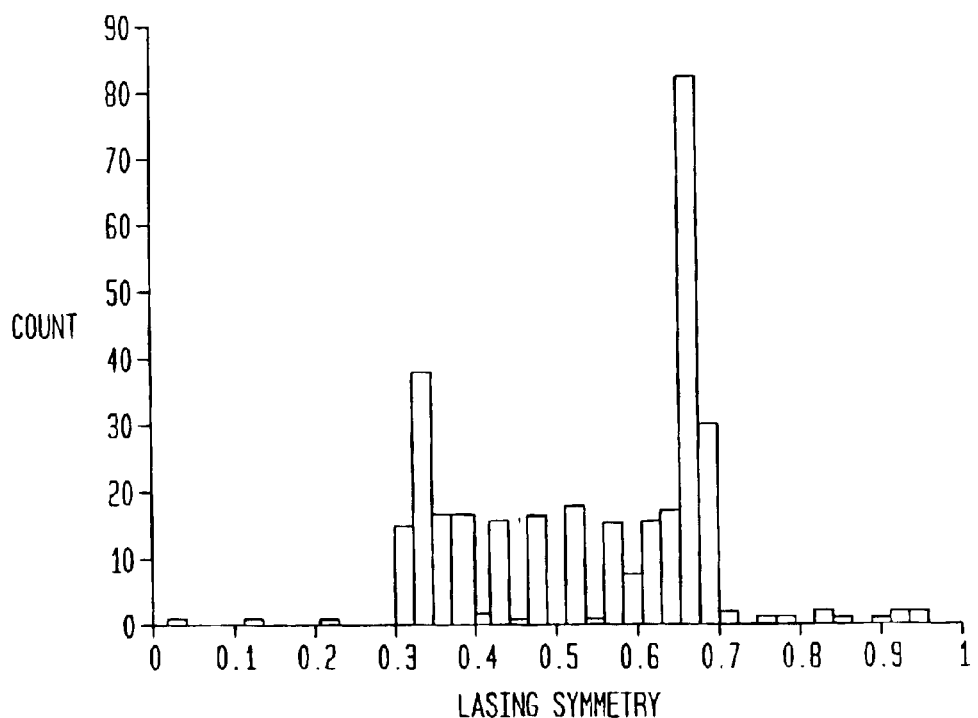
FIGS. 4 and 5 are histograms showing the distribution of lasing symmetries for DFB lasers with loss gratings, where jn=0.1 and 0.2, respectively.
Figure 5:
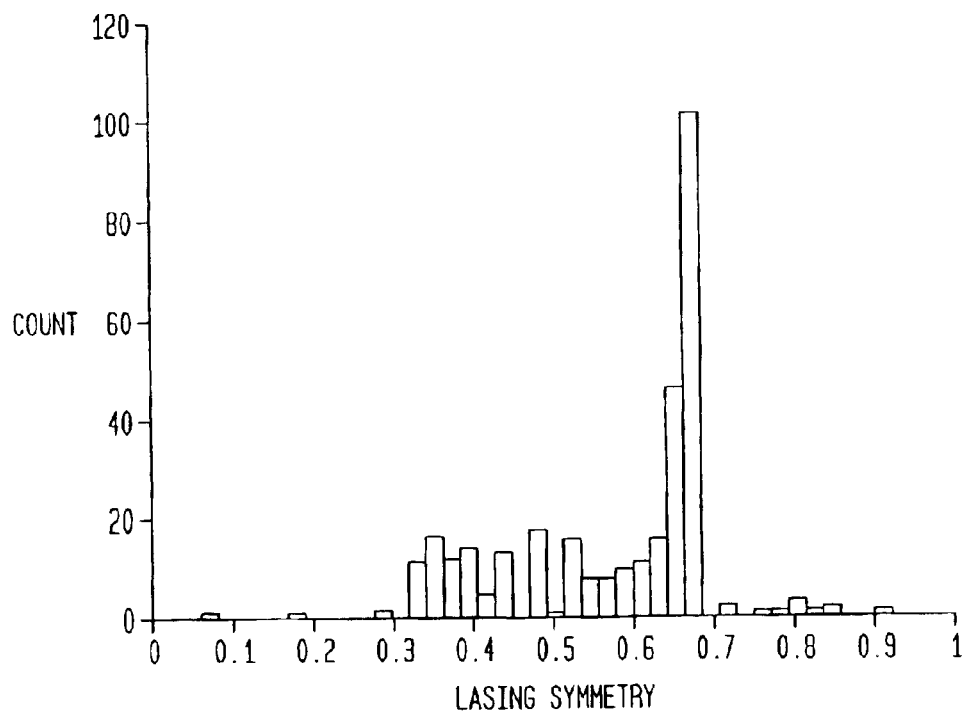

By employing equation (3), the expected lasing symmetry $L_{sym}$ for a cleaved laser 10 can be calculated for each possible combination of facet phases Ø. FIGS. 3–5 show histograms of $L_{sym}$ values for distributions calculated by varying the phases Ø at the ends of different devices in steps of 10°, from 0° to 350°, for a total of 1296 facet phase combinations for each distribution. For each histogram, the lasing symmetry distribution is characterized as a function of $\mu$ and $\sigma$, where $\mu$ represents the calculated numerical median of the distribution and $\sigma$ represents the standard deviation, on the assumption that it would be normal.

FIG. 3 shows the distribution of lasing symmetries for DFB lasers with pure index gratings ($\kappa$ is real). For $\kappa L=1.5$, the calculated median is $\mu_1=0.4998$, at a calculated standard deviation $\sigma_1=0.1573$. FIGS. 4 and 5, in contrast, show the distribution of lasing symmetries for DFB lasers 10 with loss gratings 14, where jn=0.1 and 0.2, respectively. In the FIGS. 4 and 5 distributions, the complex part jn of the coupling coefficient K is nonzero because the bandgap of the grating 14 is greater than the wavelength of the emitted radiation, and absorption occurs.

As shown in FIG. 4, the lasing symmetry distribution is shifted, and the calculated median is higher than the median for a pure index grating DFB laser because $\lambda_o$ is closer to $\lambda_m$. The calculated median for FIG. 4, where jn=0.1, is $\mu_2$=0.5859, at a standard deviation $\sigma_2$=0.1524.

With respect to FIG. 5, where the loss is increased relative to FIG. 4, the combination of facet phases yielding a lasing mode on the long wavelength side of the stopband is smaller than that calculated for FIG. 4. For FIG. 5, the calculated median is $\mu_3$=0.6435, considerably higher than the FIG. 4 value, at a standard deviation $\sigma_3$=0.1322.

Thus, the loss grating 14 may be used to increase the probability that a laser 10 cleaved from a wafer (not illustrated) operates on the short wavelength side of the stopband. As demonstrated in FIGS. 4 and 5, the percentage of devices that lase on the long-wavelength side is smaller, and consequently the yield for high SMSR at low temperature increases. Because of the more advantageous distribution for low temperature performance, an increased number of low temperature devices can be cleaved from a single wafer.

Figure 6:
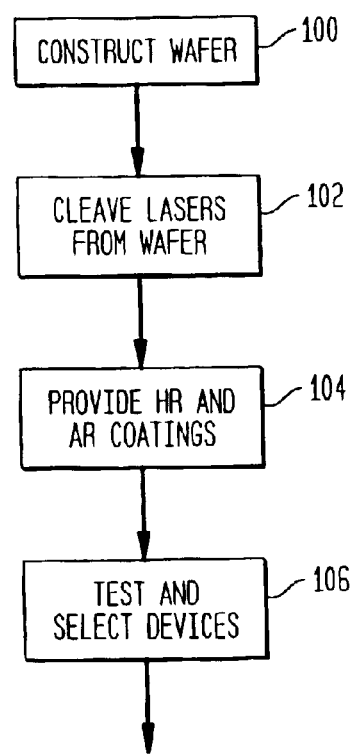
FIG. 6 is a flowchart for a method of making semiconductor lasers according to a preferred embodiment of the present invention.

Referring now to FIG. 6, a wafer (not illustrated) may be constructed 100 with layers corresponding to the substrate 12, loss grating 14, spacer 16, active layer 18, and cladding structure 20. The loss grating layer advantageously may be formed by an MOCVD process. Each layer of the wafer (including the loss grating layer) may extend with a constant thickness across essentially the full extent of the wafer. The wafer may then be cleaved 102 into a large number of devices. The cleaving process 102 forms the facets 22, 24 at different phases Ø of the loss grating 14. The facets 22, 24 are then coated 104 with the desired coatings 26, 28, and the finished lasers 10 are then tested 106 for performance characteristics. The lasers 10 that will perform well at low temperatures may be selected or identified (by, for example, analyzing the DFB mode spectroscopy) for appropriate low temperature applications. A spectrum analyzer may thus be used to select only the shortwavelength devices cleaved from the wafer.

The above description illustrates preferred embodiments which achieve the objects, features and advantages of the present invention. It is not intended that the present invention be limited to the illustrated embodiments. Any modification of the present invention that comes within the spirit and scope of the following claims should be considered part of the present invention.

What is claimed as new and desired to be protected by Letters Patent of the United States is:

1. A method of making semiconductor lasers for low temperature operation, said method comprising the steps of:
   providing a multi-layer semiconductor structure having an active layer, a loss grating of a material having a band gap greater than a target wavelength of the semiconductor lasers, and a spacer layer, said spacer layer being located between said active layer and said loss grating; and
   cleaving said multi-layer semiconductor structure such that opposed facets intersect said loss grating.

2. The method of claim 1, further comprising the step of locating highly reflective and anti-reflective coatings on said facets.

3. The method of claim 2, further comprising the step of forming said loss grating on a semiconductor substrate.

4. The method of claim 3, wherein said loss grating is formed by metal organic chemical vapor deposition or molecular beam epitaxy.

5. The method of claim 3, further comprising the step of forming a semiconductor cladding structure on said active layer.

6. The method of claim 3, wherein said semiconductor lasers are constructed to provide high side mode suppression in a positively detuned state.

7. A method of producing a plurality of distributed feedback semiconductor lasers, said method comprising the steps of:
   providing a multi-layer semiconductor wafer having an active layer, a loss grating, and a spacer layer, said spacer layer being located between said active layer and said loss grating; and
   cleaving said multi-layer semiconductor structure such that opposed facets intersect said loss grating, said loss grating shifting an emission spectrum of the lasers to a short wavelength side of a stopband.

8. The method of claim 7, further comprising the step of locating highly reflective and anti-reflective coatings on said facets.

9. The method of claim 8, wherein said loss grating has a grating period in the direction of light emission in the range of from about two thousand angstroms to about two thousand five hundred angstroms.

10. The method of claim 9, further comprising the step of forming said loss grating on a semiconductor substrate by metal organic chemical vapor deposition.

11. The method of claim 10, further comprising the step of forming a semiconductor cladding structure on said active layer.

12. The method of claim 10, wherein said spacer layer has a thickness in the range of from about three thousand angstroms to about six thousand angstroms.

13. The method of claim 12, wherein said lasers provide high side mode suppression when operated at less than −15° C.

14. The method of claim 7, further comprising the step of using a spectrum analyzer to identify said lasers.

15. A method of making semiconductor lasers for low temperature operation, said method comprising the steps of:
   providing a multi-layer semiconductor structure having an active layer, a loss grating, and a spacer layer, said spacer layer being located between said active layer and said loss grating; and
   cleaving said multi-layer semiconductor structure such that opposed facets intersect said loss grating, wherein said semiconductor lasers are constructed to provide high side mode suppression in a positively detuned state.

16. A method of producing a plurality of distributed feedback semiconductor lasers, said method comprising the steps of:
   providing a multi-layer semiconductor wafer having an active layer, a loss grating, and a spacer layer, said spacer layer being located between said active layer and said loss grating; and
   cleaving said multi-layer semiconductor structure such that opposed facets intersect said loss grating, wherein said distributed feedback semiconductor lasers provide high side mode suppression when operated at less than −15° C.

17. A method of producing a plurality of distributed feedback semiconductor lasers, said method comprising the steps of:
   providing a multi-layer semiconductor wafer having an active layer, a loss grating, and a spacer layer, said spacer layer being located between said active layer and said loss grating; and cleaving said multi-layer semiconductor structure such that opposed facets intersect said loss grating, wherein respective phase relationships between said opposed facets and said loss grating are such that said lasers have a lasing symmetry $L_{sym}$ that is greater than 0.5.

18. The method of claim 17, further comprising the step of locating highly reflective and anti-reflective coatings on said facets.

19. The method of claim 18, wherein said loss grating has a grating period in the direction of light emission in the range of from about two thousand angstroms to about two thousand five hundred angstroms.

20. The method of claim 19, further comprising the step of forming said loss grating on a semiconductor substrate by metal organic chemical vapor deposition.

21. The method of claim 20, further comprising the step of forming a semiconductor cladding structure on said active layer.

22. The method of claim 20, wherein said spacer layer has a thickness in the range of from about three thousand angstroms to about six thousand angstroms.

* * * * *